United States Patent
Pan et al.

(10) Patent No.: US 8,334,560 B2
(45) Date of Patent: Dec. 18, 2012

(54) REVERSE DISTURB IMMUNE ASYMMETRICAL SIDEWALL FLOATING GATE DEVICES

(75) Inventors: Jui-Yu Pan, Pingtung (TW); Chung-Jen Hwang, Tainan (TW); Ming-Hui Shen, Dounan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 172 days.

(21) Appl. No.: 12/829,059

(22) Filed: Jul. 1, 2010

(65) Prior Publication Data

US 2011/0049603 A1   Mar. 3, 2011

Related U.S. Application Data

(60) Provisional application No. 61/239,370, filed on Sep. 2, 2009.

(51) Int. Cl.
*H01L 29/788* (2006.01)
(52) U.S. Cl. ........ 257/316; 257/315; 257/320; 257/346; 257/E21.422; 257/E29.3
(58) Field of Classification Search .......... None
See application file for complete search history.

(56) References Cited

U.S. PATENT DOCUMENTS

| | | | |
|---|---|---|---|
| 5,494,838 A * | 2/1996 | Chang et al. | 438/264 |
| 6,096,603 A * | 8/2000 | Chang et al. | 438/258 |
| 6,747,310 B2 | 6/2004 | Fan et al. | |
| 2007/0080401 A1 * | 4/2007 | Yang | 257/346 |

FOREIGN PATENT DOCUMENTS

| CN | 1239826 A | 12/1999 |
|---|---|---|
| CN | 101118926 A | 2/2008 |

* cited by examiner

*Primary Examiner* — Andy Huynh
(74) *Attorney, Agent, or Firm* — Slater & Matsil, L.L.P.

(57) ABSTRACT

Circuits and methods for providing a floating gate structure comprising floating gate cells having improved reverse tunnel disturb immunity. A floating gate structure is formed over a semiconductor substrate comprising a floating gate, a charge trapping dielectric layer is formed, and a control gate is formed. The floating gate structure has vertical sidewalls, one side adjacent a source region and one side adjacent a drain region. A symmetric sidewall dielectric is formed over the floating gate structure on both the source side and drain side regions. An asymmetric dielectric layer is formed over the drain side sidewall only. The use of the asymmetric sidewall on the drain side sidewall provides improved RTD immunity. Methods for forming the structure are disclosed.

13 Claims, 13 Drawing Sheets

REVERSE DISTURB IMMUNE ASYMMETRICAL SIDEWALL FLOATING GATE DEVICES

This application claims the benefit of U.S. Provisional Application No. 61/239,370, entitled "Reverse Disturb Immune Asymmetrical Sidewall Floating Gate Devices and Methods," filed on Sep. 2, 2009, which is incorporated herein by reference.

TECHNICAL FIELD

The present invention relates to a floating gate memory cell structure and methods for providing a floating gate cell with improved reverse tunnel disturb immunity including asymmetrical sidewalls. The use of the invention provides advantages in a floating gate cell having an improved disturb immunity which may be fabricated in existing floating gate semiconductor processes without added expense or the need for additional photo mask production.

BACKGROUND

A common requirement for an electronic circuit and particularly for electronic circuits manufactured as integrated circuits in semiconductor processes is a non-volatile memory storage element, such as a floating gate cell. Often a module such as a FLASH, EEPROM or EPROM is provided. In these circuits, the non-volatile memory is often integrated with other, customer defined logic or licensed cores and may be integrated with other predefined or macro cells such as microprocessors, digital signal processors, cores such as ARM, RISC or similar core functions, cell phone modules, and the like.

One form of non-volatile memory cells is based on so-called "floating gates". A floating gate is a storage element which, by virtue of various program and erase mechanisms using electron transport from a channel region or terminal, can be used to store a small charge. The stored charge then may be read in a non-destructive sensing process. By sensing whether or not a charge is stored, a logic value of a "1" or a "0" may be assigned to the charge stored/not charged in the cell and thus, data may be stored and later retrieved. Using a control gate and placing various potential voltages on the control gate and drain and source regions of the floating gate device, the stored charge may be programmed and erased. By fabricating many thousands of these cells in an area, a storage module that retains the stored data when power is removed or lost from the integrated circuit is provided. For battery powered devices such as cell phones and PDAs, the floating gate non-volatile memory cells may be used to store critical information including system settings, phone numbers, contact information, photographs, sound recordings and the like that the user wants to keep permanently stored. Unlike conventional volatile memory such as dynamic RAM (DRAM), the non-volatile memory cells do not lose their stored state when power is lost (for example, when the battery dies on a battery powered device) or is removed.

Floating gates are typically provided as a part of a transistor structure. A control gate is coupled to a gate terminal and overlies, at least in part, the floating gate. The floating gate is electrically isolated from the control gate and also from the substrate, hence the name "floating". A source and drain area are formed, typically by doping areas of the substrate, and are provided and electrical connections to those areas are provided so that a channel region underlies the floating gate. By providing different electrical potentials on the control gate, and source and drain regions, electrons can be forced into the floating gate to program the cell. Also, by applying appropriate potentials, the electrons can be removed from the floating gate to erase the cell. The presence of the stored charge can be determined by reading the cell, e.g., by providing an appropriate potential on the control gate and observing current flow. A programmed cell has a different response than an erased cell. By observing the response to the cell to a read potential, the presence of a stored or non stored charge can be detected. In this manner the floating gate transistor acts as a non volatile storage cell.

FIG. 1 depicts a known split gate floating gate cell structure. In this exemplary example, the floating gate transistors are formed in pairs with certain common or shared terminals that will be described in further detail below.

In the cross section illustrated in FIG. 1, two floating gate cell devices 14 and 16 are illustrated in floating gate structure 10 sharing a common source region 23 in a semiconductor substrate 11. The substrate 11 is typically used to form an integrated circuit having many other devices on it, including additional floating gate cells, DRAM, SRAM cells, registers, logic gates, processors, mixed signal and analog circuits, and input/output devices such as buffers and drivers. Substrate 11 may be silicon, doped silicon, or it may be an epitaxial semiconductor layer such as a silicon-on-insulator (SOI) layer. Substrate 11 may also be of gallium arsenide (GaAs) or other semiconductor materials. A thin gate oxide 12 is formed over the substrate. Again, this may be formed as a thermal oxide such as silicon dioxide, although other gate oxides and gate dielectrics could be used. Floating gates 13 are formed and patterned over the thin gate oxide 12. These floating gates 13 are typically formed of a conductive gate material such as polysilicon or doped polysilicon. Because these gates are electrically isolated from other terminals of the device, they are referred to as "floating gates". A dielectric layer is formed over the floating gate; typically, a thin oxide nitride oxide (ONO) layer is used, such as layer 15 in the arrangement of FIG. 2, although other dielectrics are known and may be used. High K and low K dielectric materials may be used, for example.

Control gate 17 is then formed over the layer 15; again, this gate is typically formed of known gate materials such as polysilicon, doped polysilicon and other known gate conductor materials. Gate 17 is also patterned. An isolation dielectric 19, typically formed of silicon nitride (SiN) is formed over the control gate 17. Another isolation oxide layer, for example formed of tetraethyl orthosilicate (TEOS) 21, is formed over the SiN layer 19. This vertical floating gate cell stack 14 or 16 forms the floating gate devices. In the floating gate cells of FIG. 1, the vertical sides of stacks 14 and 16, referred to as the "sidewalls", are shown with a sidewall oxide 25 formed over them. Typically, this is formed as a thermal oxide such as a high temperature oxide (HTO). Layer 25 then provides protection for the sidewalls and isolates the sides of floating gate 13 and ONO layer 15 electrically. Because ONO layer 15 is usually formed between the polysilicon floating gate 13 and the polysilicon control gate 17, the ONO layer may be referred to as "inter-poly" or "inter-poly oxide". For the purposes of this application, the sidewalls located closer to the central common source region 23 will be referred to as "source side" sidewalls. The floating gate structures have source side sidewalls such as 33 in FIG. 1, and on the opposing side farthest away from the common source, they have drain side sidewalls such as 27.

In FIG. 1, the structure is depicted following an oxide etch step to remove the HTO oxide 25 from the substrate 11 in areas outside of the floating gate structure 10, the layer labeled PR 29 is a photo resist deposited over the structure and then patterned to protect the source side sidewalls 31 during this oxide etch step.

While the prior art floating gate structure 10 of FIG. 1 provides basic operability, in practical devices, some problems arise using this structure. A problem with reverse tunnel disturbs (RTD) has been found. In RTD sensitive circuit devices, when one floating gate cell is erased or programmed, another floating gate cell device, which is not selected and therefore not intended to be altered, has a "disturb" and charge is lost erroneously. This disturb can happen when the bias on a cell select line capacitively couples to the control gate, and the floating gate erroneously receives a voltage. In fabricating floating gate structures such as that in FIG. 1, non-uniform sidewall oxide has been observed in the areas indicated by circles 24. This thinning oxide profile (that is, in some cells, the sidewall oxide is incorrectly formed with thinned sidewall areas) results in a significant RTD effect during operation of the devices. If the RTD effect that occurs becomes sufficiently severe, the floating gate cell will not retain stored charge properly and thus, the finished integrated circuit devices may not be used.

Thus, there is a continuing need for an improved floating gate cell structure that has enhanced immunity to RTD effects. The improved floating gate cell structure and methods for fabricating the structure should remain compatible with existing and future semiconductor processes for fabricating integrated circuits, without adding significant steps or added costs.

SUMMARY OF THE INVENTION

These and other problems are generally solved or circumvented, and technical advantages are generally achieved by embodiments of the present invention, which provides an asymmetric sidewall split gate floating gate cell with RTD immunity and methods for fabricating the asymmetric sidewall floating gate cells. The methods are arranged to form an asymmetric sidewall that provides RTD immunity with steps that are compatible with the existing process flows used in semiconductor manufacturing.

In an exemplary embodiment, an apparatus is provided comprising a semiconductor substrate; at least one floating gate structure having vertical sidewalls and comprising: a floating gate disposed over the substrate; a first dielectric layer disposed over the floating gate; a control gate disposed over the first dielectric layer; at least one dielectric disposed over the control gate; a first symmetric vertical sidewall dielectric disposed over a source side sidewall and a drain side sidewall of the vertical sidewalls of the at least one floating gate structure; and a second asymmetric vertical sidewall dielectric disposed over the first symmetric vertical sidewall dielectric only over the drain side sidewalls of the floating gate structure.

In another exemplary embodiment, an integrated circuit device is provided, comprising: a semiconductor substrate; at least one pair of floating gate cells formed adjacent a common source region in the substrate, each of the floating gate cells further comprising: at least one floating gate structure having vertical sidewalls and comprising: a floating gate disposed over the substrate; a first dielectric layer disposed over the floating gate; a control gate disposed over the first dielectric layer; at least one dielectric disposed over the control gate. The integrated circuit embodiment further comprises a first symmetric vertical sidewall dielectric disposed over a source side sidewall and a drain side sidewall of the vertical sidewalls of the at least one floating gate structure; and a second asymmetric vertical sidewall dielectric disposed over the first symmetric vertical sidewall dielectric only over the drain side sidewalls of the floating gate structure.

In another exemplary embodiment, a method is provided comprising defining a source region on a semiconductor substrate; forming at least one floating gate structure adjacent the source region and having vertical sidewalls, the vertical sidewall adjacent the source region forming a source side sidewall, the vertical sidewall away from the source region forming a drain side sidewall, the at least one floating gate structure comprising a floating gate, a dielectric layer over the floating gate, a control gate over the dielectric layer, and at least one dielectric layer over the control gate. The method embodiment continues by forming a first symmetric vertical sidewall dielectric over the floating gate structure and the substrate and on the source side and drain side sidewalls; patterning a first photo resist over the first symmetric vertical sidewall dielectric; removing the first symmetric vertical sidewall dielectric from the substrate while the first symmetric vertical sidewall dielectric remains on the source side and drain side sidewalls of the floating gate structure; forming a second asymmetric vertical sidewall dielectric over the floating gate structure and the substrate; patterning a second photo resist over the floating gate structure and the substrate; and removing the second asymmetric vertical sidewall dielectric from the source side sidewall of the floating gate structure and the substrate while the second asymmetric vertical sidewall dielectric remains over the drain side sidewall.

This summary gives an overview of certain embodiments of the invention, and is not limiting. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE FIGURES

For a more complete understanding of the present invention, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
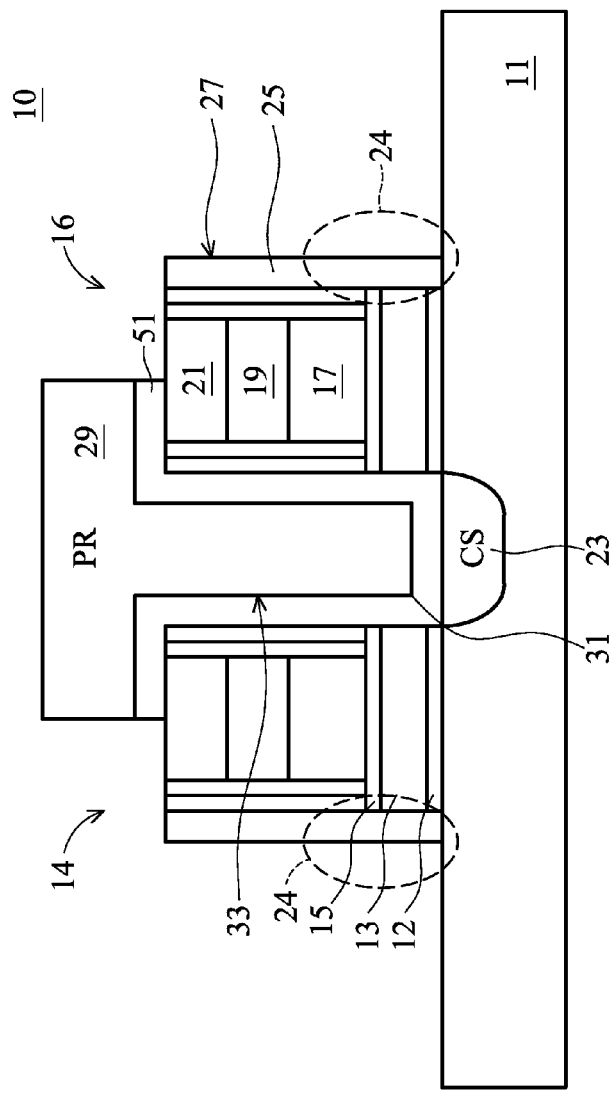
FIG. 1 illustrates a prior art floating gate device at an intermediate stage of fabrication.
Figure 2:
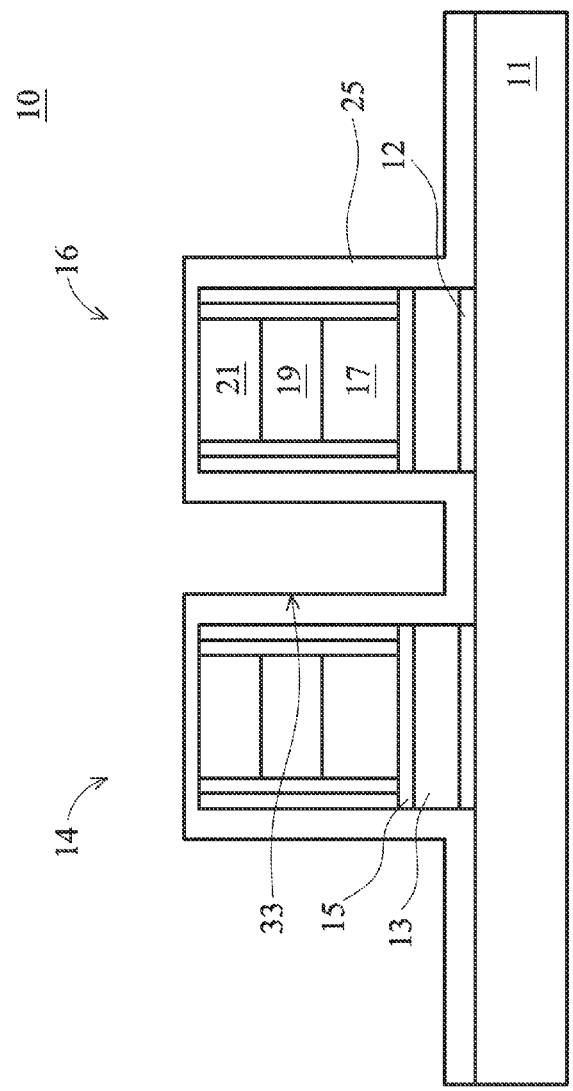
FIG. 2 depicts a conventional floating gate structure having two floating gate devices formed to share a common source at an intermediate stage of fabrication.

FIG. 2 depicts in one exemplary embodiment a cross-sectional view of a conventional floating gate structure 10 at an intermediate process step. An oxide layer 25 is shown formed over the two floating gate devices 14 and 16 that share the common source (not yet formed) between them. Substrate 11 is covered with a thin gate oxide 12, floating gates 13 are formed over the thin gate oxide 12, inter-poly oxide or ONO layer 15 is formed over the floating gate, control gate 17 is disposed on the inter-poly oxide layer 15, silicon nitride, silicon oxide, oxynitride, or other dielectrics form layer 19 as shown over the control gate 17, and another dielectric layer 21 such as tetraethyl orthosilicate (TEOS) is formed over the SiN layer 19. The cross section of FIG. 2 shows the floating gate structure 10 at an intermediate process step, following a first high temperature oxide (HTO) deposition to form layer 25 over the top surface of dielectric layer 21, the vertical sidewalls of the floating gate structures, and the substrate 11. Again, the floating gate devices have a sidewall closest to the central region where the source deposition will be made. This side is the source side sidewall 33 for each floating gate device, and the other sidewall on the opposing side of the structure is the drain side sidewall.

Figure 3:
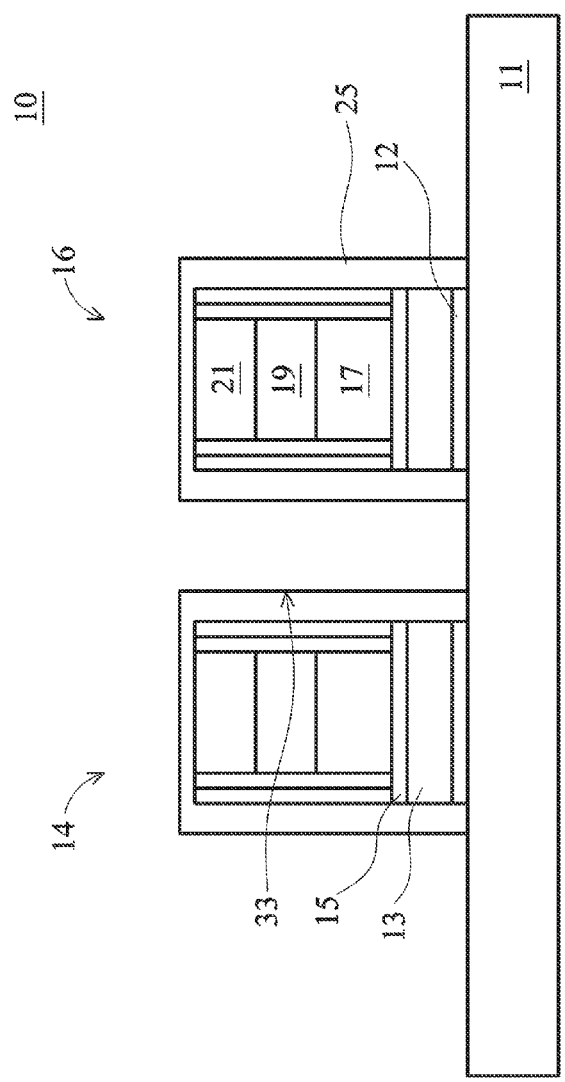
FIG. 3 depicts the floating gate structure of FIG. 2 following an etch step.

FIG. 3 depicts the floating gate structure 10 of FIG. 2 following an additional processing step. In FIG. 3, the HTO oxide layer 25 is etched in a first spacer etch process. The HTO oxide 25 is removed partially, or entirely, from the surface of the substrate and the upper surfaces of the floating gate structures. The etch may be performed as a wet etch or a dry etch and dilute HF, for example, may be used as an etchant.

Figure 4:
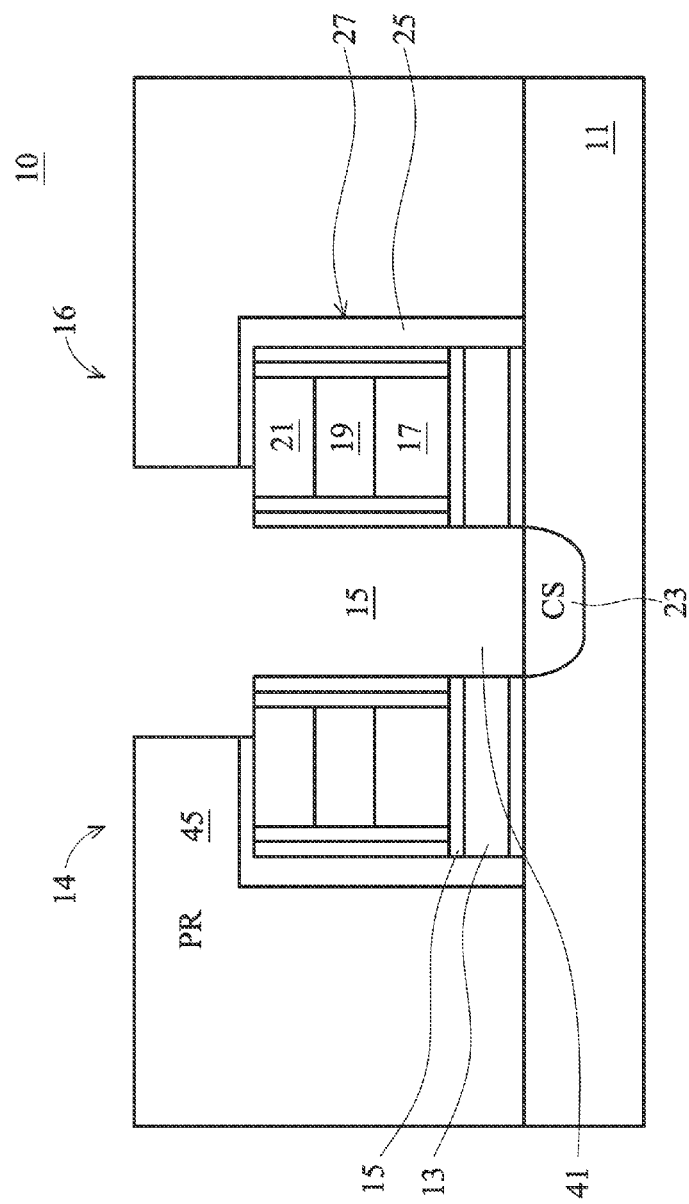
FIG. 4 illustrates the floating gate structure of FIG. 3 following an implant step to form a common source.

FIG. 4 depicts the floating gate structure 10 following additional steps. In FIG. 4, PR mask 45 is deposited and patterned to open the common source area between the two floating gate cells for the common source implant to form the doped source region 23. The PR 45 is patterned to open the space 15 between the two floating gate structures. The common source implant may be performed using a high voltage ion implant (HVII) or other implantation step. Dopant atoms are introduced into the substrate 11 to form a doped source region 23 that is shared or "common" between the two floating gate cells 14 and 16. Following the common source implant step, etching is performed to remove the oxide 25 from the sidewalls of the two floating gate cells 14 and 16. PR 45 protects the drain side sidewall 27 from the etchant.

Figure 5:
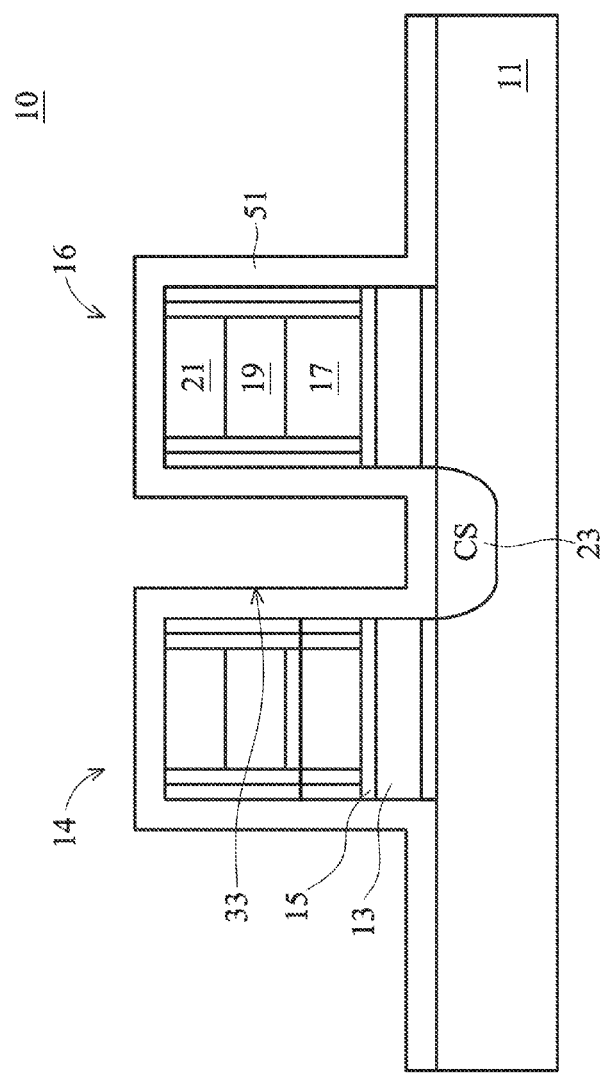
FIG. 5 illustrates in a cross section the floating gate structure of FIG. 4 following an oxidation step to form sidewalls on the floating gate structure.

FIG. 5 depicts the conventional floating gate structure 10 of FIG. 4 following an additional processing step. In FIG. 5, the structure 10 is exposed to a second HTO oxide deposition step. Layer 51 is then formed of HTO oxide over the top surface of the floating gate cells, and over the substrate 11, including over the common source region 23. The HTO also is deposited on the source side sidewalls 33.

Figure 6:
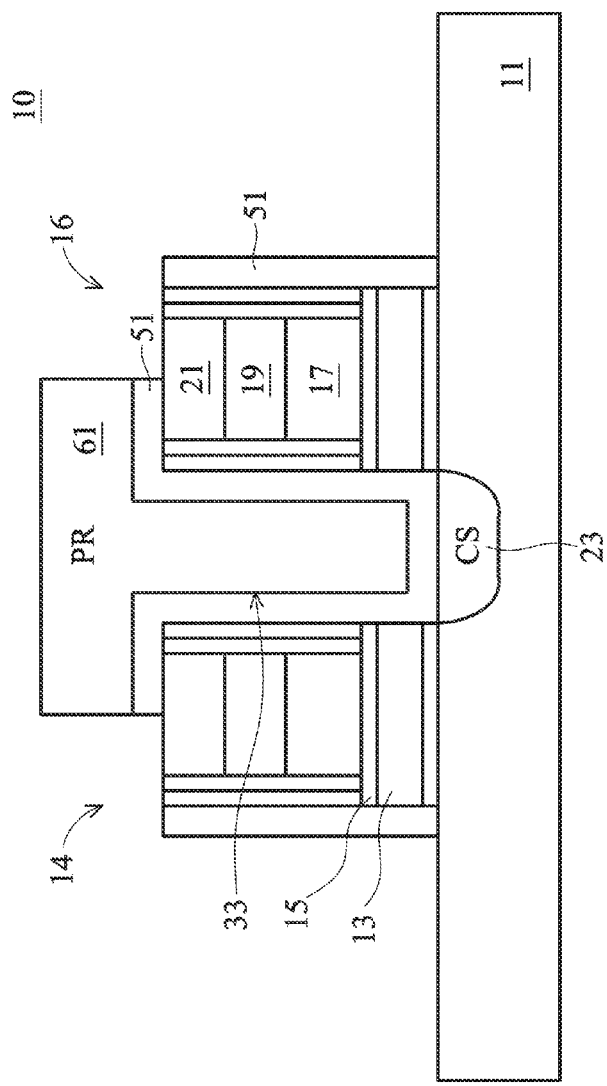
FIG. 6 illustrates the conventional floating gate structure of FIG. 5 following another etch step.

FIG. 6 depicts the conventional floating gate structure 10 following another process step. In FIG. 6, a photo resist 61 is deposited and patterned to provide a mask for the source side sidewall 33 for oxide 51 of the floating gate cells. After the photo resist is patterned, the substrate is then etched using an oxide removal etch to remove the oxide 51 from the substrate. This step may also be used for other portions of an integrated circuit having a variety of devices being processed at the same time, such as a logic core, the input/output or I/O, and word lines that are not shown in FIG. 6. All of these areas may also have oxides that are also removed in this process step. Substrate 11 is then exposed to additional processing steps. The processing also continues to complete other portions of the integrated circuit after the structure of FIG. 6 is formed. As described in the background of this application, the conventional floating gate structure of FIG. 6 exhibits undesirable RTD characteristics. Inspection of completed devices using the conventional process of FIGS. 2-6 reveals that the thermal oxide formed on the drain side sidewalls is sometimes thinner than desired. This thinning problem, especially near the top edge of the ONO layer 15, is believed to be responsible for the RTD problems seen with devices fabricated in this manner. Further, the ability to form uniform thickness and uniform quality tunnel oxide on the drain side sidewalls using the conventional process steps described above is limited, and many defects may occur and have been observed.

Figure 7:
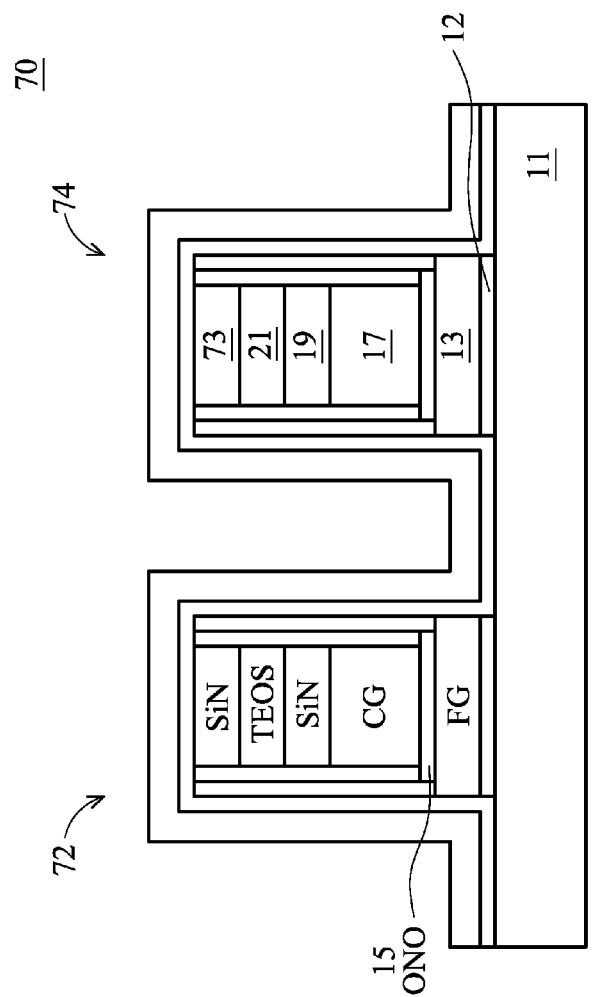
FIG. 7 illustrates in a simplified cross sectional view an embodiment of the invention at an intermediate processing step.

FIG. 7 depicts in a cross sectional view an intermediate process step for a floating gate structure 70 that is an exemplary embodiment of the invention. In FIG. 7, the floating gate cells 72 and 74 again comprise a thin oxide 12 over a semiconductor substrate 11, a floating gate 13 formed over the thin oxide 12, a control gate 17, an ONO or interpoly dielectric 15 between the floating gate and the control gate 17, and a dielectric layer 19. Dielectric layer 19 is typically of silicon nitride, although silicon dioxide, silicon oxynitride and other dielectrics could also be used. Another dielectric layer 21, typically of TEOS or another oxide, is formed over the silicon nitride layer 19. A first silicon nitride or silicon oxynitride layer 73 is formed over the floating gate structures and over the vertical sidewalls of the floating gate structures. As shown in FIG. 7, a second silicon nitride layer 75 is shown lying over the top surface of the floating gate structures, and over the vertical surface of the sidewalls, and over the substrate 11. This second layer may be formed using any of several known processes. In one exemplary process, a reoxidation or ReOX is formed followed by a silicon nitride deposition, which may include another ReOX, an HTO step, and a subsequent SiN deposition is used to form layer 75. Enhanced plasma deposition may be used, for example. Alternatively, thermal SiN deposition may be used.

Figure 8:
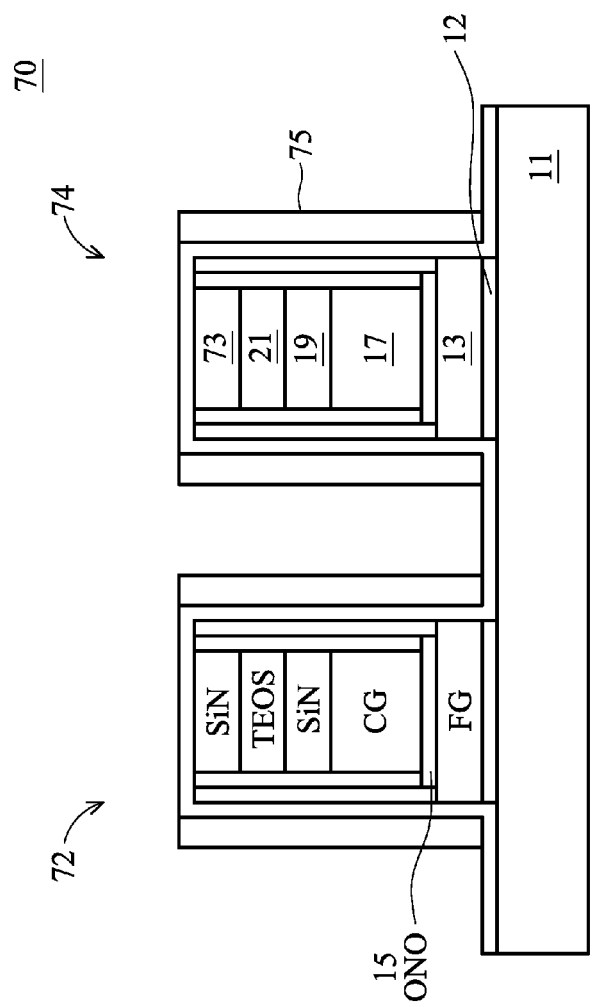
FIG. 8 depicts in a cross sectional view the embodiment of FIG. 7 following an etch step.

FIG. 8 depicts the exemplary embodiment floating gate structure 70 of FIG. 7 following a spacer etch back process step. This anisotropic etch partially or completely removes the silicon nitride 75 from the surface of substrate 11.

Figure 9:
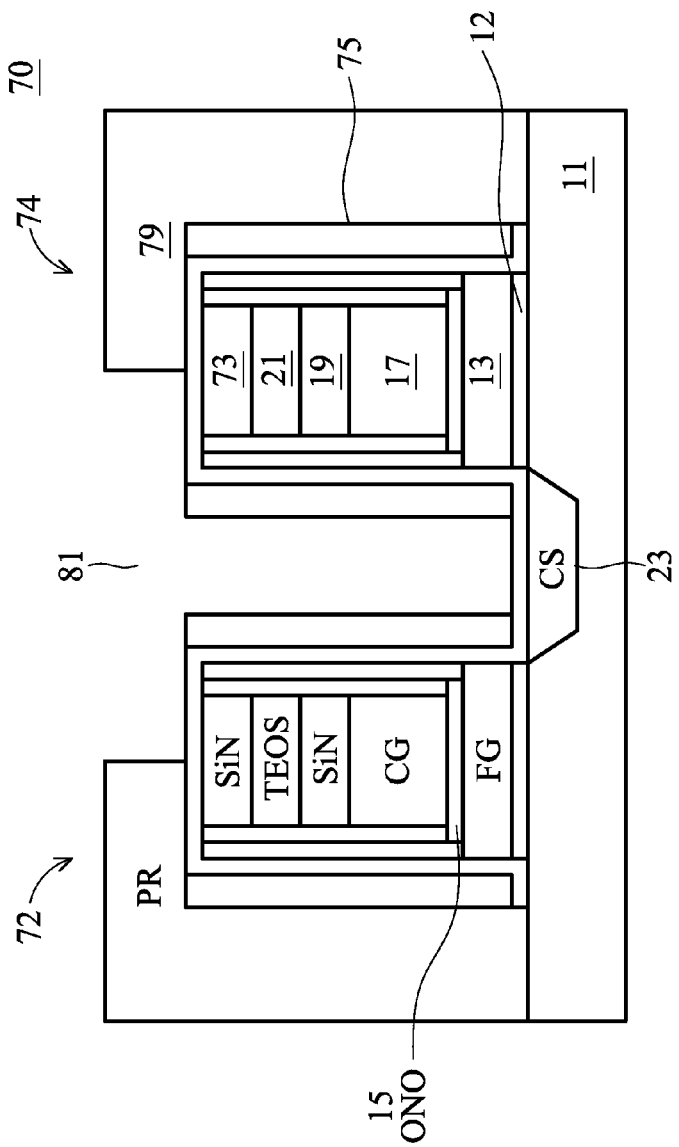
FIG. 9 depicts in a cross sectional view the embodiment of FIG. 8 following an implant step.

FIG. 9 depicts the floating gate structure 70 of the embodiment of FIG. 8 after additional process steps. In FIG. 9, the floating gate cells 72 and 74 are first covered with a photo resist PR 79 which is then patterned to open the space 81 between the two floating gate cells. A common source region 23 is formed in the substrate using the high voltage ion implant (HVII) or other ion implant to form a doped region in substrate 11. Common source region 23 is shared between the two floating gate cells 72 and 74. An isotropic sidewall etch of the source side sidewalls of the floating gate cells, removing that portion of silicon nitride sidewall layer 75, is then performed. This etch may be selective and may stop on an optional HTO layer (not shown) formed between the two SiN layers 73 and 75; if used, this HTO acts as an etch stop layer. Other process controls such as time could be used to control the etch of the source side silicon nitride. The PR 79 protects the drain side sidewall layer 75 so that it remains in place following this isotropic etch. Thus, the final sidewall formed is asymmetric; the source side sidewall of cells 72 and 74 has one layer of silicon nitride that extends to the top surface of the floating gate layer 13 and slightly past that top surface, while the drain side sidewall of cells 72 and 74 has two silicon nitride layers 73 and 75 covering it. In this non-limiting example, the second SiN layer 75 extends to the bottom of the floating gate layer and thus provides additional isolation on the drain side sidewall of the floating gate cells 72 and 74 in structure 70.

Figure 10:
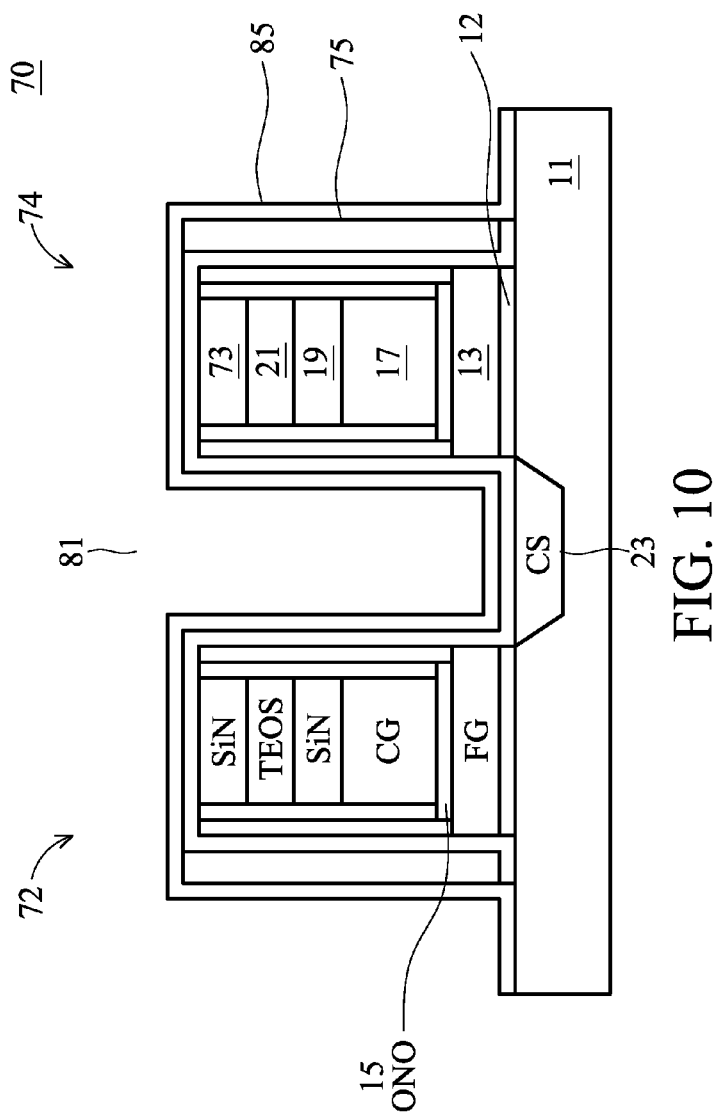
FIG. 10 depicts in another cross sectional view the embodiment of FIG. 9 following an oxidation step.

FIG. 10 in cross section depicts the exemplary floating gate structure embodiment 70 of FIG. 9 following additional process steps. In FIG. 10, the floating gate structure 70 is again subjected to an HTO oxide deposition that forms oxide layer 85 over the sidewalls, both source side and drain side, of the floating gate cells 72 and 74, the substrate 11 including the common source region 23, and the upper surface of the floating gate cells over the silicon nitride layer 73. The HTO deposition forms a thin tunnel oxide layer 85 on the source side sidewalls and the thickness and quality of this layer is very critical to the performance of the floating gate cells. Accordingly, process monitor control wafers may be used in the process equipment to provide a method for critical measurements of this layer to be taken in situ, that is, during processing, or ex situ, that is, post processing, in order to ensure layer 85 meets the defined quality and thickness standards for the process.

Figure 11:
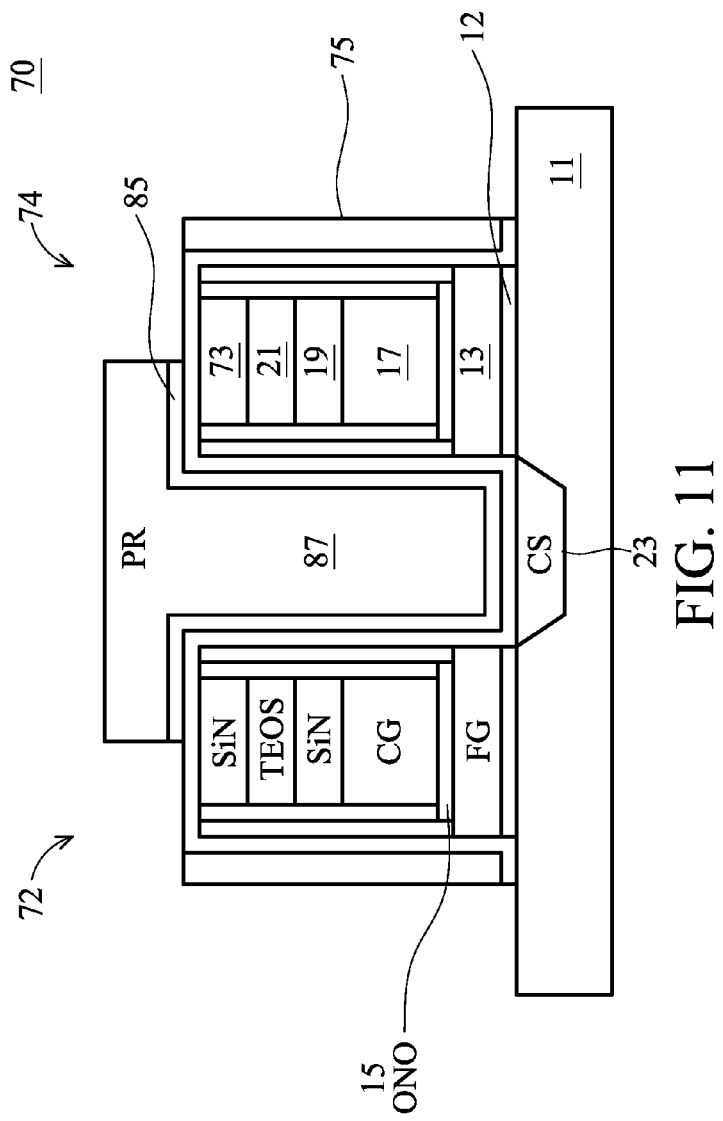
FIG. 11 depicts in another cross sectional view the embodiment of FIG. 10 following another etch step.

FIG. 11 depicts in a cross sectional view the exemplary embodiment floating gate structure 70 following a pattern and etch step to remove the HTO oxide layer 85 from the drain side sidewalls of the floating gate cells 72 and 74. Photo resist 87 is formed and patterned to protect the source side sidewalls and portions of layer 85 (HTO oxide 85) during the etch. An isotropic oxide etch step is performed and removes the HTO oxide from the drain side sidewalls, removing the HTO from the drain side sidewalls and silicon nitride layer 75, and the substrate 11 in the areas apart from the floating gate cells, while the HTO oxide 85 remains on the vertical sidewalls on the source side sidewalls of the floating gate cells, and over a portion of the top surface of the floating gate cells. The HTO shown remaining on the top surface of the cell structures in the figure will be removed in the subsequent process, step.

Figure 12:
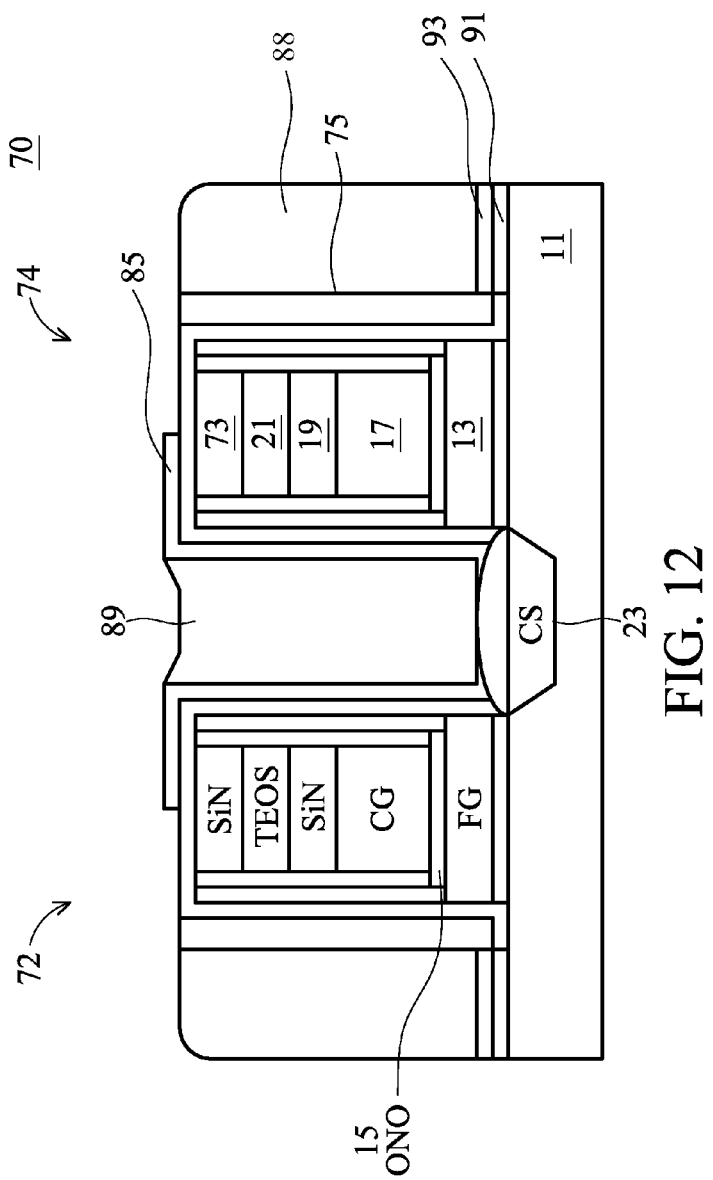
FIG. 12 depicts in another cross sectional view the embodiment of FIG. 11 following a polysilicon deposition step.

FIG. 12 depicts the resulting floating gate structure 70 following the above described several additional process steps. Select gate 88 and erase gate 89 are formed of polysilicon at the same time as other polysilicon depositions are formed on the integrated circuit, for example, word line polysilicon may be used. The completed floating gate structure 70 is characterized by the use of an asymmetric sidewall structure. On the source side sidewalls of the floating gate cells 72 and 74, the sidewalls are formed of one layer of silicon nitride, layer 73, and an HTO oxide layer 85. On the drain side sidewalls, the sidewalls on the floating gate cells 72 and 74 are formed of two silicon nitride layers 73 and 75 and there is no HTO oxide layer. Additional gate oxides are formed during processing of other elements on the integrated circuit, such as gate oxides for the core and periphery transistors, these are shown in the figure as elements 91 and 93.

Figure 13:
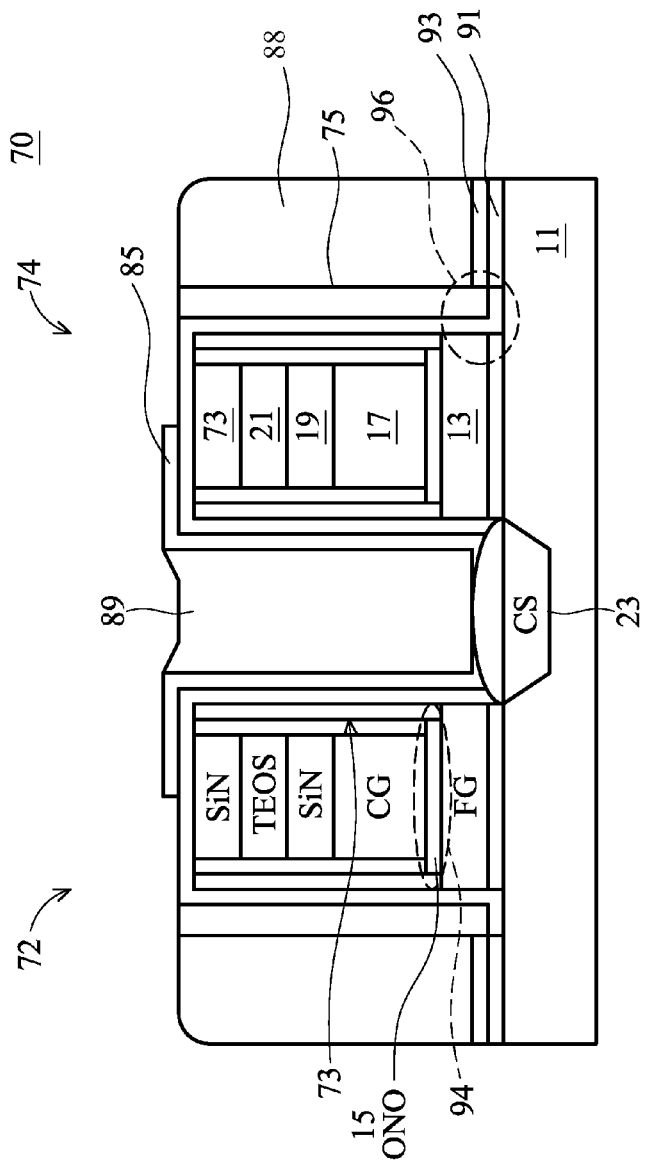
FIG. 13 depicts a cross sectional view of the embodiment of FIG. 11 with certain features emphasized.

FIG. 13 illustrates some features of the invention. In a dashed circle 94, the symmetrical sidewall spacer of SiN 73 around the inter-poly oxide 15 is shown, which provides better inhibition ability as compared to the prior art floating gate structures, and retains a good coupling ratio. The coupling ratio means the ratio of control gate voltage coupling to floating gate, and it correlates to the capacitance of inter-poly oxide 15. To retain a good coupling ratio, the symmetrical sidewall spacer of SiN 73 acts to protect the thickness of inter-poly oxide. This avoids encroachment due to the thermal diffusion in the subsequent processes. Element 96 is a dashed circle that indicates the sidewall asymmetry area, where on the drain side sidewalls only, a second silicon nitride layer 75 is formed. This added silicon nitride spacer extends to, or nearly to, an area adjacent the bottom of the floating gate 13 and provides better sidewall profile control, over the inconsistent sidewalls obtained with the prior art approaches, the use of the invention also provides improved RTD immunity for the floating gate cells of structure 70.

Although exemplary embodiments of the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. An apparatus, comprising:
   a semiconductor substrate;
   at least one floating gate structure having vertical sidewalls and comprising:
   a floating gate disposed over the substrate;
   a first dielectric layer disposed over the floating gate;
   a control gate disposed over the first dielectric layer;
   at least one dielectric disposed over the control gate;
   a first symmetric vertical sidewall dielectric disposed over a source side sidewall and a drain side sidewall of the vertical sidewalk of the at least one floating gate structure;
   a second asymmetric vertical sidewall dielectric disposed over the first symmetric vertical sidewall dielectric over the drain side sidewalk but not the source side sidewall of the floating gate structure;
   an erase gate disposed adjacent the source side sidewall; and
   a select gate disposed adjacent the drain side sidewall;
   wherein the erase gate is spaced from the source side sidewall by the first symmetric vertical sidewall dielectric and a tunnel oxide layer overlying the source side sidewall, and the select gate is spaced from the drain side sidewall by the second asymmetric vertical sidewall dielectric and the first symmetric vertical sidewall dielectric and not by the tunnel oxide layer.

2. The apparatus of claim 1, and further comprising a common source region formed in the substrate adjacent the source side sidewalk of the floating gate structure, the source region having a first side adjacent the source side sidewalls and a second opposing side.

3. The apparatus of claim 2 and further comprising:
a second floating gate structure disposed over the substrate adjacent the second side of the source region, the second floating gate structure further comprising:
a second floating gate disposed over the substrate;
a fourth dielectric layer disposed over the floating gate;
a control gate disposed over the fourth dielectric layer;
at least one dielectric disposed over the control gate;
a third symmetric vertical sidewall dielectric disposed over a source side sidewall and a drain side sidewall of the vertical sidewalls of the second floating gate structure; and
a fourth asymmetric vertical sidewall dielectric disposed over the third symmetric vertical sidewall dielectric only over the drain side sidewalls of the second floating gate structure.

4. The apparatus of claim 3, wherein the at least one floating gate structure and the second floating gate structure form floating gate cells that share a common source region.

5. The apparatus of claim 1 wherein the at least one floating gate structure forms a non-volatile memory cell.

6. The apparatus of claim 1 wherein the first symmetric vertical sidewall dielectric comprises a silicon nitride layer.

7. The apparatus of claim 1 wherein the second asymmetric vertical sidewall dielectric comprises a silicon nitride layer.

8. The apparatus of claim 1 where the tunnel oxide layer comprises a high temperature oxide layer.

9. An integrated circuit device, comprising:
a semiconductor substrate;
at least one pair of floating gate cells formed adjacent a common source region in the substrate,
each of the floating gate cells further comprising:
at least one floating gate structure, having vertical sidewalls and comprising:
a floating gate disposed over the substrate;
a first dielectric layer disposed over the floating gate;
a control gate disposed over the first dielectric layer;
at least one dielectric disposed over the control gate;
a first symmetric vertical sidewall dielectric disposed over a source side sidewall and a drain side sidewall of the vertical sidewalls of the at least one floating gate structure;
a second asymmetric vertical sidewall dielectric disposed over the first symmetric vertical sidewall dielectric over the drain side sidewalls but not the source side sidewall of the at least one floating gate structure;
an erase gate disposed adjacent the source side sidewall; and
a select gate disposed adjacent the drain side sidewall;
wherein the erase gate is spaced from the source side sidewall by the first symmetric vertical sidewall dielectric and a tunnel oxide layer overlying the source side sidewall, and the select gate is spaced from the drain side sidewall by the second asymmetric vertical sidewall dielectric and the first symmetric vertical sidewall dielectric and not by the tunnel oxide layer.

10. The integrated circuit of claim 9 wherein the first symmetric vertical sidewall dielectric comprises a silicon nitride layer.

11. The integrated circuit of claim 10 wherein the second asymmetric vertical sidewall dielectric comprises a silicon nitride layer.

12. The integrated circuit of claim 11 wherein an etch stop layer is disposed between the first symmetric vertical sidewall dielectric and the second asymmetric vertical sidewall dielectric.

13. The integrated circuit of claim 9 and further comprising a common source region formed of dopant ions implanted into the substrate between the floating gate cells and adjacent the source side sidewalls.

* * * * *

UNITED STATES PATENT AND TRADEMARK OFFICE
CERTIFICATE OF CORRECTION

PATENT NO. : 8,334,560 B2
APPLICATION NO. : 12/829059
DATED : December 18, 2012
INVENTOR(S) : Pan et al.

Page 1 of 1

It is certified that error appears in the above-identified patent and that said Letters Patent is hereby corrected as shown below:

In Col. 8, line 54, claim 1, delete "sidewalk" and insert --sidewalls--.
In Col. 8, line 58, claim 1, delete "sidewalk" and insert --sidewalls--.
In Col. 9, line 5, claim 2, delete "sidewalk" and insert --sidewalls--.

Signed and Sealed this
Ninth Day of April, 2013

Teresa Stanek Rea
*Acting Director of the United States Patent and Trademark Office*